United States Patent
Parran et al.

(10) Patent No.: US 6,667,475 B1
(45) Date of Patent: Dec. 23, 2003

(54) METHOD AND APPARATUS FOR CLEANING AN ANALYTICAL INSTRUMENT WHILE OPERATING THE ANALYTICAL INSTRUMENT

(75) Inventors: Shachar Parran, Qiryat Ono (IL); Itzak Yair, Rehovot (IL)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/365,130

(22) Filed: Feb. 11, 2003

Related U.S. Application Data

(60) Provisional application No. 60/438,938, filed on Jan. 8, 2003.

(51) Int. Cl.$^7$ .................................................. H01J 37/18
(52) U.S. Cl. ............. 250/306; 250/307; 250/310; 250/311; 250/441.11; 134/1.1; 134/18; 134/20
(58) Field of Search .................................. 250/306, 307, 250/310, 311, 441.11, 492.2; 134/1.1, 1.2, 18, 20, 21

(56) References Cited

U.S. PATENT DOCUMENTS

| | | | |
|---|---|---|---|
| 5,510,624 A | | 4/1996 | Zaluzec |
| 5,633,502 A | * | 5/1997 | Fischione .............. 250/441.11 |
| 5,753,009 A | | 5/1998 | Sirkar et al. |
| 6,105,589 A | | 8/2000 | Vane |
| 6,332,925 B1 | | 12/2001 | Noji et al. |
| 6,501,077 B1 | | 12/2002 | Sawahata et al. |

\* cited by examiner

*Primary Examiner*—Kiet T. Nguyen
(74) *Attorney, Agent, or Firm*—Blakely Sokoloff Taylor & Zafman

(57) ABSTRACT

A method and apparatus for cleaning an analytical instrument while operating the analytical instrument are described. In one embodiment, a method comprises evacuating hydrocarbons from a specimen chamber of an analytical instrument into a plasma chamber via a mesh. The plasma is ignited in the plasma chamber to react with the hydrocarbons.

38 Claims, 3 Drawing Sheets

METHOD AND APPARATUS FOR CLEANING AN ANALYTICAL INSTRUMENT WHILE OPERATING THE ANALYTICAL INSTRUMENT

This application claims the benefit of the filing date of the following Provisional U.S. Patent Application: "IN-SITU SEM CLEANING DEVICE ENABLING CLEANING WHILE OPERATING SEM", application No. 60/438,938, filed Jan. 8, 2003.

FIELD OF THE INVENTION

The present invention relates to cleaning analytical instruments such as Scanning Electron Microscopes (SEM), Scanning Electron Microprobes, Transmission Electron Microscopes (TEM) and other charge particle beam instruments that are subject to contamination problems from hydrocarbons. In particular it is a method and apparatus for cleaning the specimen chamber, specimen stage, and specimen in-situ inside the vacuum system of these instruments.

BACKGROUND OF THE INVENTION

Electron microscopy is used to detect, measure, and analyze constituents present in very small areas of materials. Contaminants adsorbed on the surface or surface films interacting with the incident electron probe beam can distort the results. Deposits created by the interaction of the probe beam with the surface specimen also may interfere with the probe beam or emitted electrons and x-rays and thus adversely affect accurate analysis. Deposits also add uncertainty to SEM measured line widths for semiconductor device critical dimension metrology.

Another problem is the condensation of pump oils on the windows of the x-ray and electron detectors distorting results. An additional problem of this type is the absorption of low-energy x-rays from Be, C, N, O and F by oil films which can prevent measurement of these elements by X-ray emission spectroscopy.

Contaminants typically are introduced by one of four ways including the specimen, the specimen stage, carried into the chamber by the evacuation system, or are present on the internal components of the instrument. Contaminants introduced from the evacuation system can be reduced by trapping, by purging, or by using cleaner pumps. Once present inside the chamber these contaminants reside on the chamber surfaces, and are typically removed slowly with a low efficiency high vacuum pump.

Inorganic specimens (metals, ceramics, semiconductors, etc.) may carry contaminants into the chamber. These may be part of the specimen, residues from sample preparation techniques or be caused by improper sample handling or storage techniques. In addition, clean surfaces will accumulate a surface film of hydrocarbon scum if left exposed to ordinary room air for any length of time. The sources of these hydrocarbons are most any living thing, organic object, or other source of hydrocarbon vapors in the vicinity. While the part of the films created in these processes dissipate under vacuum conditions, a small amount generally remains on surfaces and is sufficient to cause problems when the specimen is subsequently examined in the analytical instruments listed.

These residues are widely distributed and generally are at low concentrations on the various surfaces. Some of the contaminant molecules become mobile in the vacuum environment. At high vacuum the mean free path of molecules once vaporized is comparable to or longer than the dimensions of the vacuum chamber of these instruments. The contaminants move in the vapor phase from surface to surface in the vacuum environment and are attracted to any focused electron probe beam, forming deposits through an ionization and deposition process. Since these contaminants can travel large distances within the vacuum chamber and over the surface of a specimen, it is important to remove or immobilize these species as much as possible prior to an analysis without disturbing the microstructure of the specimen.

Glow-discharge systems for cleaning SEM chambers use viscous flow vacuum dynamics to carry contaminants from the chamber to the roughing pumps. Most of the current literature and recent patents on glow-discharge cleaning and plasma etch is concerned with the use of these processes in semiconductor production. A variety of gases can be used for etching and cleaning. Gases such as Hydrogen, Argon, Nitrogen, Oxygen, $CF_4$ and gas mixtures such as air and argon/oxygen have successfully been used for glow-discharge cleaning and plasma etching.

Hydrocarbon reactions with oxygen radicals are the dominant reactions in glow discharge cleaning methods using oxygen as a reactant gas. The glow discharge is used to produce oxygen ions that are then transformed into oxygen radicals by subsequent reactions. The oxygen ions are not needed as the reactive species for hydrocarbons. In the absence of nitrogen ions or other reactive species that destroy O radicals, O radicals are long lived and have the ability to do isotropic cleaning on all surfaces in the chamber. $CF_4$ or other fluorine containing gases are sometimes added to oxygen containing plasmas to speed the oxidation of hydrocarbons by performing hydride extraction on the base molecules to make them more susceptible to oxygen attack.

Generally, the normal operation of the SEM is discontinued while the specimen chamber is evacuated of the hydrocarbons using glow-discharge. This results in lost time during the analysis of the specimen. Additionally, vacuum pumps fail to remove the oxidized hydrocarbons from the chamber, thus, distorting the results of the SEM's specimen analysis. Lastly, at high concentrations and pressures of plasmas, organic samples within the specimen chamber can be damaged or even destroyed.

SUMMARY OF THE INVENTION

A method and apparatus for cleaning an analytical instrument while operating the analytical instrument are described. In one embodiment, a method comprises evacuating hydrocarbons from a specimen chamber of an analytical instrument into a plasma chamber via a mesh. The plasma is ignited in the plasma chamber to react with the hydrocarbons.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for cleaning an analytical instrument while operating the analytical instrument are described. In one embodiment, a method comprises evacuating hydrocarbons from a specimen chamber of an analytical instrument into a plasma chamber via a mesh. The plasma is ignited in the plasma chamber to react with the hydrocarbons. In the following description, for purposes of explanation, numerous specific details are set forth in order to provide a thorough understanding of the present invention. It will be evident, however, to one skilled in the art that the present invention may be practiced without these specific details.

Figure 1:
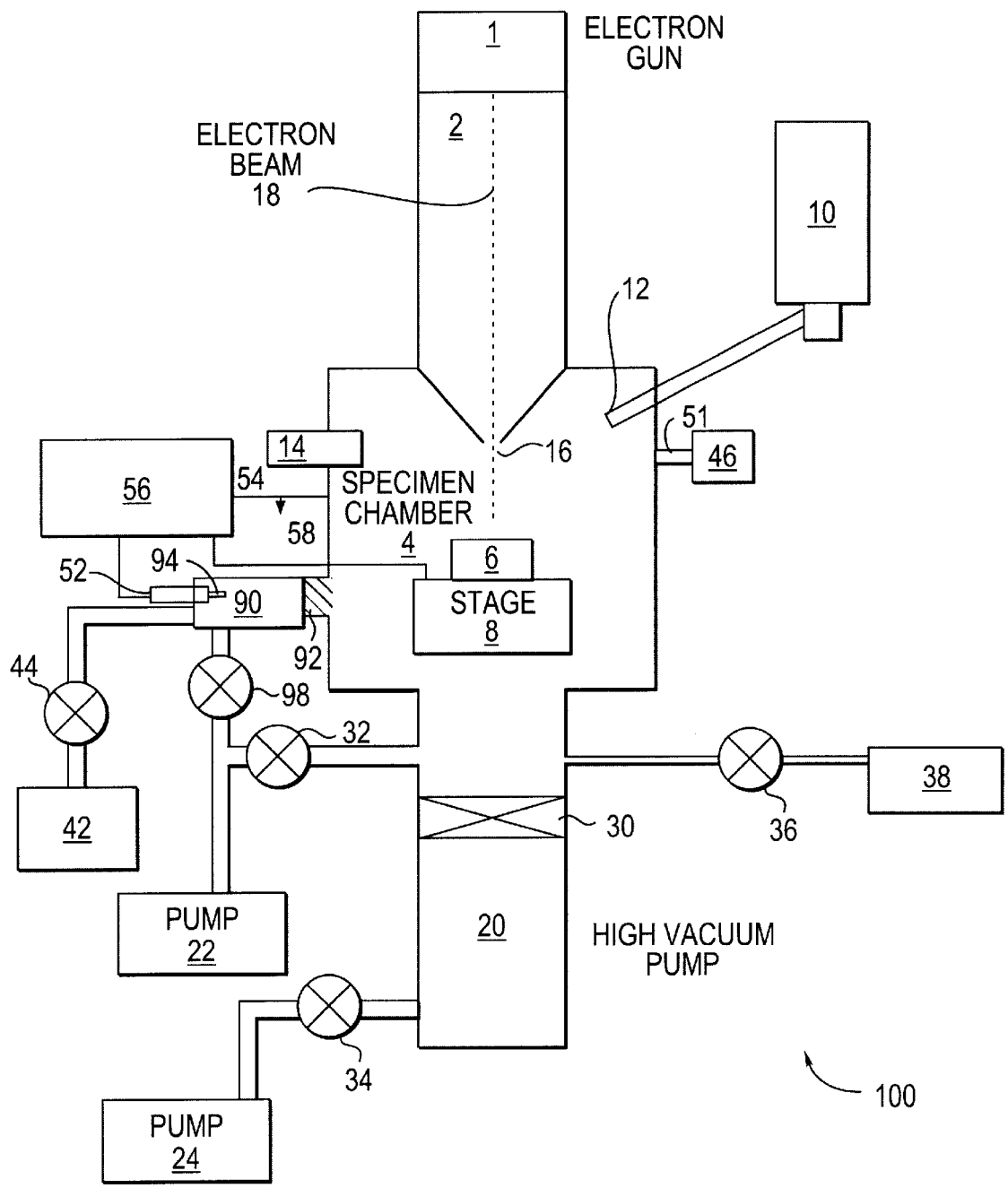
FIG. 1 is a schematic diagram of a scanning electron microscope with a plasma cleaning device installed, according to an exemplary embodiment of the present invention.

FIG. 1 is a schematic of a Scanning Electron Microscope (SEM) with a plasma-cleaning device installed. Electron gun 1 generates electron beam 18, which is focused and scanned within electron column 2. The beam 18 exits through aperture 16 into specimen chamber 4 and scans across specimen 6. The specimen 6 is mounted on stage 8. The stage 8 can be manipulated to mechanically locate the specimen under the beam 18. The specimen 6 emits electrons and x-rays when scanned and a variety of detectors are used to obtain analytical information. The most important of these are secondary electron detector 14 and Energy Dispersive (EDS) x-ray detector with a x-ray spectrometer 10. The x-ray detector is separated from the specimen chamber 4 by a x-ray window 12.

Electron scanning for microscopy is done under vacuum conditions. Typically the specimen chamber 4 is connected to high vacuum pump 20 thorough valve 30. Foreline pump 24 is used to pump the exhaust of the high vacuum pump 20. Valve 34 separates the high vacuum pump and foreline pump. Pre-evacuation or roughing the chamber 4 is done by means of roughing pump 22 that connects to the chamber by way of roughing valve 32. While evacuating the chamber 4, a rough vacuum must be obtained first before the high vacuum pump 20 can function. In some arrangements of SEMs, the functions of foreline pump 24 and the roughing pump 22 are combined through means of a valving system so that only one low vacuum pump is needed for both functions. Venting of the chamber 4 takes place through vent valve 36 using vent gas supply 38 or air. Many SEM models provide automatic valve sequencing controller 26 (not shown in FIG. 1) to simplify evacuation of the microscope for the user. For most models the user interface consists of a VENT and EVAC or similar push-button control.

A plasma chamber 90 with an interior glow discharge electrode 94 is attached to specimen chamber 4 via membrane 92. The plasma chamber 90 is connected to a RF or DC generator 56 through vacuum feedthrough 52 that is connected to the electrode 94. Electrode 94 is activated by an integrated RF antenna. The output of generator 56 is controlled to limit the power and the temperature of the glow-discharge plasma that is excited between the grounded plasma chamber 90 wall.

The method of the present invention limits the power or voltage supplied to the plasma so that it is dominated by the production of oxygen ions and radicals rather than nitrogen ions and other active nitrogen species. An additional embodiment of the present invention uses the change of color or optical emission of the glow discharge as a method for selecting the proper power or voltage upper limit for plasma generation dominated by oxygen ions and radicals.

In one embodiment of the present invention, the exterior of the chamber 4 and the generator 56 are connected to ground through cable 58. Cable 58 may be the ground shield of a coaxial cable with cable 54 at the center. For an embodiment containing a RF generator a RF matching network may be included in the circuit. Glow-discharge gas supply 42 supplies the reactive gas for the glow-discharge. In one embodiment of the present invention this reactive gas is $O_2$ plasma. The gas may be any mixture of oxygen and/or nitrogen. Valve set 44 controls the reactive gas flow into plasma chamber 90. The reactive gas is fed directly into the plasma chamber 90. Pressure gauge 46 is used to monitor the chamber 4 vacuum during cleaning and may be mounted on the specimen chamber 4. In one embodiment, another pressure gauge is used to monitor the plasma chamber 90.

Mesh 92 allows for the separation and removal of hydrocarbons from the mixture of gases in specimen chamber 4.

There are a number of processes and treatment strategies to address this problem: carbon adsorption, condensation, absorption, incineration, catalytic oxidation, biofiltration, UV oxidation, and membrane fractionation. These technologies have their own disadvantages. Incineration produces other dangerous compounds. Condensation systems and absorption systems are bulky, costly, and experience flooding and loading problems. Scrubbing solvents, absorption materials, and catalysts must all be regenerated or replaced. Biofiltration requires bulky equipment, which typically cannot handle a variety of hydrocarbon mixtures.

While mesh 92 is exposed to the hydrocarbon containing gas within specimen chamber 4, additional processes occur within plasma chamber 90, to draw the hydrocarbons through mesh 92 to evacuate chamber 4. Plasma chamber 90 maintains a low vapor pressure of hydrocarbons. The plasma chamber 90 vacuum exists at $1-10^{-2}$ torr. wherein specimen chamber 4 is maintained at $10^{-5}-10^{-7}$ torr. The hydrocarbon relative pressure in chamber 90 is $10^{-15}$ torr while in specimen chamber 4 the hydrocarbon relative pressure is $10^{-7}$ to $10^{-9}$ torr. This difference in pressure draws hydrocarbons from chamber 4 through mesh 92, to plasma chamber 90, where the plasma is ignited using RF antenna 94 and is converted to $H_2O$ and $CO_2$. Pump 22 continuously pumps the $H_2O$ and $CO_2$ out of the chamber 90. This provides the partial pressure differential driving force for permeation of individual hydrocarbons as well as other species present in the gas mixture.

Figure 2:
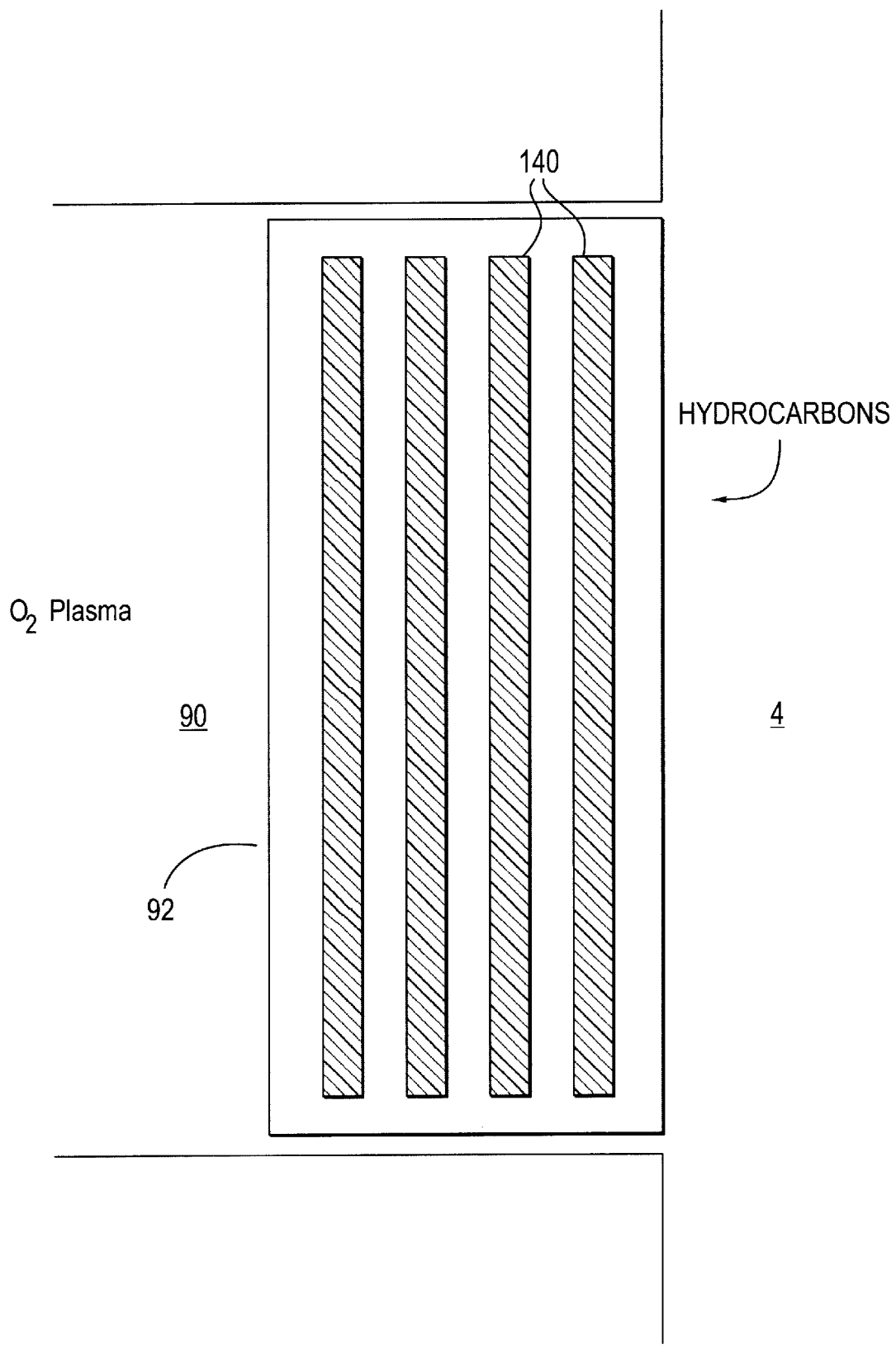
FIG. 2 illustrates a schematic diagram of mesh, according to an exemplary embodiment of the present invention.

FIG. 2 illustrates a schematic diagram of mesh 92 according to one embodiment of the present invention. Mesh 92 has many characteristics. One characteristic of mesh 92 is to block $O_2$ plasma from entering specimen chamber 4 and damaging the specimen. Another characteristic of mesh 92 is that it allows any material including the hydrocarbons to pass through the mesh. Yet, another characteristic of mesh 92 is to maintain a seal between plasma chamber 90 and specimen chamber 4, so that distinctly different vacuum pressures can be maintained in each chamber. Mesh 92 allows a small leak of gas to return inside chamber 4, however the gas leaked in is removed by pump 20.

Mesh 92 is either an array of criss cross metal wires which are arranged very densely or a ceramic porous material. The mesh transfers any kind of material the rate of leak is a function of pressure on both mesh sides.

The present invention indirectly uses the oxygen radicals to oxidize the hydrocarbon stage. One embodiment of the present invention obtains a uniform, non-destructive and fast cleaning action by using a low-temperature plasma in a separate glow-discharge chamber 90 to generate oxygen radicals which attract hydrocarbon into the chamber 90 by convection. Nitrogen/oxygen gas mixtures that contain 19%–30% oxygen are good choices for preferential removal of hydrocarbon films. A high percentage (>50%) oxygen mixture is avoided because of the explosion hazard in the oil sealed vacuum pumps 22 and 24. The cleaning action of the present method takes place due to the reactive-neutral oxygen radical species in chamber 90. These react with the hydrocarbon molecules to break them up and oxidize them for removal as gases. By creating the plasma in a separate chamber at low power, high-energy ion bombardment of the surfaces in the specimen chamber 4 is avoided to prevent damage and etching of the base materials.

Figure 3:
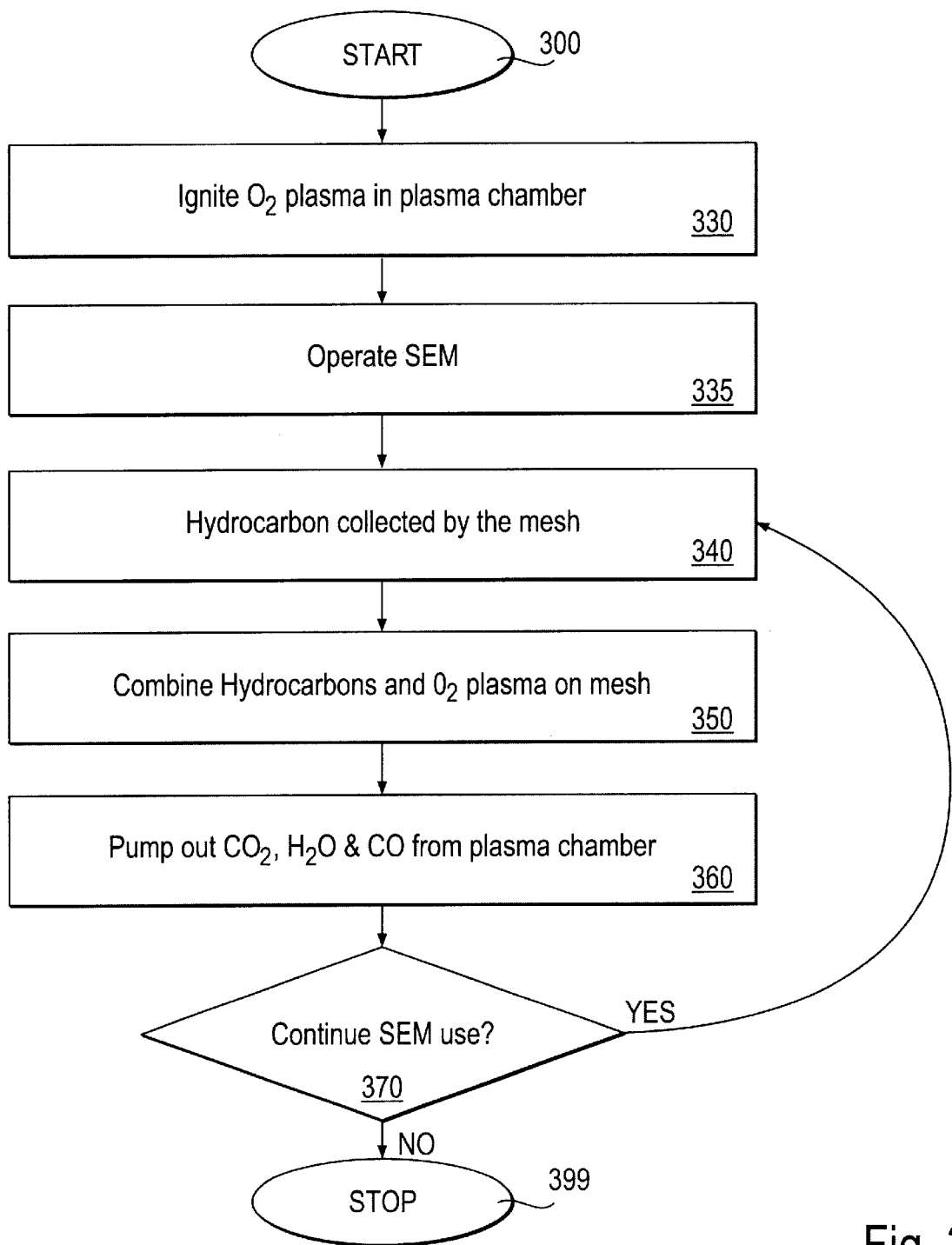
FIG. 3 illustrates a process of cleaning an analytical instrument while operating it, according to one embodiment of the present invention.

FIG. 3 illustrates a process of cleaning an analytical instrument while operating it, according to one embodiment of the present invention. The process commences at block 300. Although the SEM may not be analyzing a specimen, it is still self-cleaning. Hydrocarbons are released under high vacuum pressures from plastics and other objects within specimen chamber 4, and a hydrocarbon build-up occurs.

$O_2$ is pumped into plasma chamber 90 by pump 44 and then ignited with RF antenna and electrode 94, to generate oxygen radicals at processing block 330. The flow of $O_2$ into plasma chamber 90 is continuous from gas supply 42. The SEM is used at block 335 to examine a specimen. At processing block 340, the hydrocarbons in specimen chamber 4 being attracted to the oxygen radicals, are collected by mesh 92.

While contained on mesh 92, the hydrocarbons react with the oxygen radicals to generate $CO_2$, CO and $H_2O$. Mesh 92 only allows a small amount of the $CO_2$, CO and $H_2O$ molecules to pass back into specimen chamber 4, at processing block 350. These substances are pumped out of specimen chamber 4 with pump 20. At processing block 360, the $H_2O$, $CO_2$ and CO are pumped out of the plasma chamber 90 by pump 22. If the user desires to continue cleaning SEM 100, as checked at decision block 370, the process continues to eradicate hydrocarbons from specimen chamber 4, by returning to block 340, otherwise the process completes at block 399.

In another embodiment, the process is continued even after the SEM is deactivated. By continuing operation, the specimen chamber 4 will not accumulate additional hydrocarbon buildup.

Thus, a method and for cleaning an analytical instrument while operating the analytical instrument have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A method, comprising:
    evacuating hydrocarbons from a specimen chamber of an analytical instrument into a plasma chamber via a mesh; and
    igniting plasma in the plasma chamber to react with the hydrocarbons.

2. The method of claim 1, further comprising evacuating molecules generated by igniting the plasma in the plasma chamber.

3. The method of claim 2, wherein the analytical instrument is a charged particle beam instrument including a scanning electron microscope, and a transmission electron microprobe.

4. The method of claim 3, further comprising:
    operating the analytical instrument to analyze a specimen while evacuating the hydrocarbons.

5. The method of claim 4, wherein the molecules are oxidized hydrocarbons including carbon monoxide, carbon dioxide and water.

6. The method of claim 5, wherein a specimen chamber vacuum pressure is less than a plasma chamber vacuum pressure.

7. The method of claim 6, wherein the specimen chamber vacuum pressure is between $1 \times 10^{-5}$ torr and $1 \times 10^{-7}$ torr.

8. The method of claim 6, wherein the plasma chamber vacuum pressure is between 1 torr and $1 \times 10^{-2}$ torr.

9. The method of claim 6, wherein igniting the plasma comprised using an RF antenna to ignite the plasma.

10. An apparatus, comprising:
    means for allowing hydrocarbons to flow from a specimen chamber of an analytical instrument into a plasma chamber; and means for igniting plasma in the plasma chamber to react with the hydrocarbons.

11. The apparatus of claim 10, further comprising means for evacuating molecules generated by igniting the plasma in the plasma chamber.

12. The apparatus of claim 11, wherein the analytical instrument is a charged particle beam instrument including a scanning electron microscope, and a transmission electron microprobe.

13. The apparatus of claim 12, further comprising:
    means for operating the analytical instrument to analyze a specimen while evacuating the hydrocarbons.

14. The apparatus of claim 13, wherein the molecules are oxidized hydrocarbons including carbon monoxide, carbon dioxide and water.

15. The apparatus of claim 14, wherein a specimen chamber vacuum pressure is less than a plasma chamber vacuum pressure.

16. The apparatus of claim 15, wherein the specimen chamber vacuum pressure is between $1 \times 10^{-5}$ torr and $1 \times 10^{-7}$ torr.

17. The apparatus of claim 15, wherein the plasma chamber vacuum pressure is between 1 torr and $1 \times 10^{-2}$ torr.

18. The apparatus of claim 15, wherein igniting the plasma comprised using an RF antenna to ignite the plasma.

19. An apparatus, comprising:
    a plasma chamber; and
    a mesh connected to the plasma chamber;
    wherein the mesh permits hydrocarbons to flow from a specimen chamber of an analytical device into the plasma chamber; and
    wherein plasma is ignited in the plasma chamber to react with the hydrocarbons and generate molecules.

20. The apparatus of claim 19, further comprising an RF antenna attached to the plasma chamber, wherein the RF antenna ignites the plasma in the plasma chamber.

21. The apparatus of claim 20, wherein the analytical instrument is a charged particle beam instrument including a scanning electron microscope, and a transmission electron microprobe.

22. The apparatus of claim 21, wherein the analytical instrument can be used to analyze a specimen while hydrocarbons are evacuated from its specimen chamber.

23. The apparatus of claim 22, wherein molecules in the plasma chamber are oxidized hydrocarbons including carbon monoxide, carbon dioxide and water.

24. The apparatus of claim 23, wherein a specimen chamber vacuum pressure is less than a plasma chamber vacuum pressure.

25. The apparatus of claim 24, wherein the specimen chamber vacuum pressure is between $1\times10^{-5}$ torr and $1\times10^{-7}$ torr.

26. The apparatus of claim 24, wherein the plasma chamber vacuum pressure is between 1 torr and $1\times10^{-2}$ torr.

27. The apparatus of claim 24, further comprising a plasma pump that pumps the plasma into the plasma chamber.

28. The apparatus of claim 24, further comprising a roughing pump that evacuates the molecules from the plasma chamber.

29. An analytical device, comprising:

a plasma chamber; and a specimen chamber connected to the plasma chamber via a mesh;

wherein the mesh permits hydrocarbons to flow from a specimen chamber of an analytical device into the plasma chamber; and wherein plasma is ignited in the plasma chamber to react with the hydrocarbons and generate molecules.

30. The analytical device of claim 29, further comprising an RF antenna attached to the plasma chamber, wherein the RF antenna ignites the plasma in the plasma chamber.

31. The analytical device of claim 30, wherein the analytical device is a charged particle beam instrument including a scanning electron microscope, and a transmission electron microprobe.

32. The analytical device of claim 31, wherein the analytical device can be used to analyze a specimen while hydrocarbons are evacuated from its specimen chamber.

33. The analytical device of claim 32, wherein molecules in the plasma chamber are oxidized hydrocarbons including carbon monoxide, carbon dioxide and water.

34. The analytical device of claim 33, wherein a specimen chamber vacuum pressure is less than a plasma chamber vacuum pressure.

35. The analytical device of claim 34, wherein the specimen chamber vacuum pressure is between $1\times10^{-5}$ torr and $1\times10^{-7}$ torr.

36. The analytical device of claim 34, wherein the plasma chamber vacuum pressure is between 1 torr and $1\times10^{-2}$ torr.

37. The analytical device of claim 34, further comprising a plasma pump that pumps the plasma into the plasma chamber.

38. The analytical device of claim 34, further comprising a roughing pump that evacuates the molecules from the plasma chamber.

* * * * *